(12) United States Patent
Katsap

(10) Patent No.: US 9,165,737 B2
(45) Date of Patent: Oct. 20, 2015

(54) HIGH-BRIGHTNESS, LONG LIFE THERMIONIC CATHODE AND METHODS OF ITS FABRICATION

(71) Applicant: NuFlare Technology, Inc., Kanagawa (JP)

(72) Inventor: Victor Katsap, Glenham, NY (US)

(73) Assignee: NuFlare Technology, Inc., Kanagawa (JP)

(*) Notice: Subject to any disclaimer, the term of this patent is extended or adjusted under 35 U.S.C. 154(b) by 95 days.

(21) Appl. No.: 13/644,281

(22) Filed: Oct. 4, 2012

(65) Prior Publication Data

US 2014/0097736 A1    Apr. 10, 2014

(51) Int. Cl.
*H01J 19/04* (2006.01)
*H01J 1/14* (2006.01)
*H01J 1/13* (2006.01)
*H01J 9/04* (2006.01)
*H01J 1/148* (2006.01)
*H01J 37/065* (2006.01)

(52) U.S. Cl.
CPC . *H01J 1/14* (2013.01); *H01J 1/148* (2013.01); *H01J 9/04* (2013.01); *H01J 37/065* (2013.01); *H01J 2237/06308* (2013.01)

(58) Field of Classification Search
USPC .......... 313/34, 310, 346 R, 346 DC, 311, 336
See application file for complete search history.

(56) References Cited

U.S. PATENT DOCUMENTS

2004/0150322 A1* 8/2004 Busta ............................ 313/495
2005/0174030 A1* 8/2005 Katsap ...................... 313/346 R
2010/0301736 A1* 12/2010 Morishita et al. ............. 313/341

OTHER PUBLICATIONS

Office Action in corresponding KR application No. 10-2013-67877, dated Sep. 14, 2014, and translation.

* cited by examiner

*Primary Examiner* — Nimeshkumar Patel
*Assistant Examiner* — Brenitra M Lee
(74) *Attorney, Agent, or Firm* — Whitham Curtis Christofferson & Cook, PC

(57) ABSTRACT

An improved cathode comprises a cone-shaped emitter with a carbon-based coating applied to the emitter cone surface, in which there is a narrow annular gap between the emitter body and the carbon coating. The gap prevents direct contact between the carbon coating and the crystalline emitting material, thereby preventing damaging interactions and extending the useful lifetime of the cathode.

15 Claims, 4 Drawing Sheets

HIGH-BRIGHTNESS, LONG LIFE THERMIONIC CATHODE AND METHODS OF ITS FABRICATION

BACKGROUND OF THE INVENTION

1. Field of the Invention

The invention generally relates to improvements in thermionic cathodes with carbon-coated surfaces. In particular, the invention provides a cathode in which a gap is present between the carbon coating and the cathode's surface, thereby preventing interaction of carbon and the crystalline emitter material which would otherwise cause damage to the cathode.

2. Background of the Invention

Lanthanum hexaboride (LaB6), cerium hexaboride (CeB6), hafnium carbide (HfC), in sintered or crystalline form, are used as electron sources, or emitters, in various electron-beam tools (e.g. lithographic tools, scanning electron microscopes (SEMs), transmission electron microscopes (TEMs, etc). A typical emitter is tapered, or cone-shaped, with a specified tip or truncation size and cone angle, as shown in FIG. 1A.

The tip (truncation) may be flat or spherical, with diameter from 5 to 100 μm and a cone angle of from 60 to 110 degrees, depending on the application. These cathodes, however, have two built-in disadvantages: Disadvantage 1: at operating temperatures (1650 to 1900 K), emitter material evaporates, and tip size continuously diminishes, which limits the cathode's useful life time. Disadvantage 2: under operating conditions, the electron beam is formed by electrons emitted from both the tip and the cone surface. Electrons emitted from the cone surface constitute up to 65% of the total emission current, but cannot be used in well-focused beams (Ref. 1).

It is thus advantageous to suppress or eliminate material evaporation and electron emission from the cathode cone surface. This may be done, for example, by coating the cone surface with carbon. (Ref. 2). A cross-sectional view of a cathode with a carbon coated cone surface is shown in FIG. 1B. At cathode operating temperatures (e.g. 1650 to 1900 K), the carbon coating's evaporation rate is very low, e.g. ~1000 times lower than that of LaB6 or CeB6, with a vapor pressure at just $10^{-10}$ Torr, which is practically negligible. Hence, the coating does not change its dimensions during the cathode lifetime (about 3000 hrs). In other words, carbon-coated cathodes (e.g. carbon-coated K—LaB6, K—CeB6, and K—HfC) exhibit neither electron emission nor carbon evaporation, and the inherent disadvantages of LaB6 cathodes discussed above are eliminated by the coating Nevertheless, carbon coatings have disadvantages. Such cathodes have a limited lifetime, caused by both emitter erosion and loss by evaporation, and this loss is caused, in part, by chemical interactions between the carbon coating and the LaB6/CeB6 cathode material. This can be observed in the photograph shown in FIG. 1C, which shows the flat surface of a cone's emitting surface surrounded by the adjacent carbon coating. As can be seen, the edges of the emitting surface of the cone which are in contact with the carbon coating appear to be damaged (e.g. pitted and/or etched). In fact, these areas of the emitting surface are compromised and are no longer capable of efficiently emitting electrons in a focused manner. Thus, in spite of the advantages conferred by the carbon coating, the useful lifetime of the cathode has been attenuated by the contact with the carbon coating.

There is a need in the art to develop alternative ways of extending the lifetime of cathodes. For example, there is a need to develop new cathode coatings that exhibit the positive attributes of carbon coatings, but which do not have the problems associated with carbon coatings.

SUMMARY OF THE INVENTION

The present invention provides electron emitting thermionic cathodes with enhanced lifetimes. The conical surfaces of the emitter of the cathodes are protected by a layer (coating) of carbon to prevent material evaporation and electron emission. However, in contrast to the prior art, in the cathodes of the invention, a gap is present between the carbon layer and the electron emitting material of the cone region. The presence of the gap prevents direct contact between the carbon coating and the underlying crystalline emitting material, thereby preventing or reducing chemical reactions between the two. Therefore, the emitting surface of the cathode does not sustain damage as a result of reactions with carbon, and the useful lifetime of the cathode is significantly extended. Accordingly, the invention provides a cathode with long life and high angular intensity and brightness. Methods of fabricating such cathodes are also encompassed by the invention, as are apparatuses (assemblies) which include, for example, a cathode of the invention and other elements such as a cathode holder or support, a heat source (heater), etc.

DETAILED DESCRIPTION

Figure 1A:
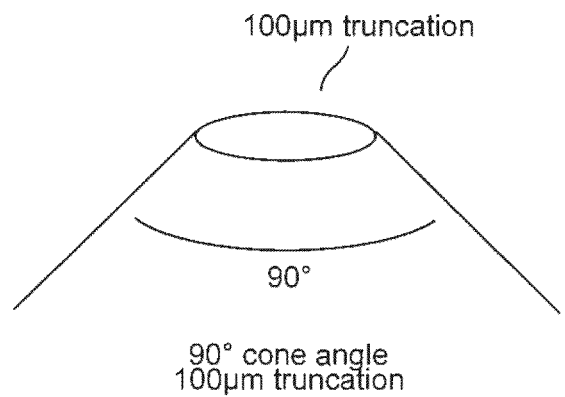
FIG. 1A-C. Representations of prior art. A, schematic representation of a cathode showing the tip (emitting surface), cone angle, and cone surface; B, schematic representation of a cathode with carbon-coated cone surface; C, photograph of damage to the emitting surface of a conventional carbon-coated cathode.
Figure 1B:
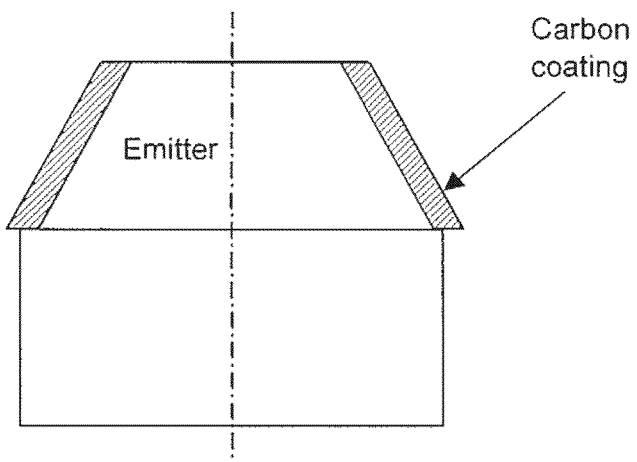
Figure 1C:
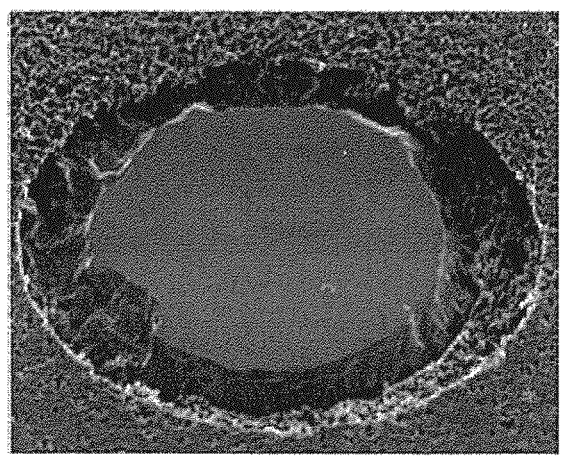

According to the invention, an innovative cathode includes a single crystal emitter which comprises a tip, a cone and sides, and a layer of carbon (a carbon coating) on the emitter sides and the emitter cone surface. However, the emitter cone surface is physically separated (gapped) from the carbon coating, i.e. in the vicinity of the emitter cone, the carbon layer does not make direct contact with the emitter material. Instead, a narrow annular gap is present between the conical portion of the emitter body and the carbon coating. The carbon coating thus surrounds the conical emitter surface but is not directly affixed to it, i.e. it is similar to a "shield" spaced apart from the emitter surface. Because the gap is narrow, the carbon layer is still close enough to the cone surface to limit the emitter evaporation rate from the cone surface. However, direct interaction between the conical emitter surface and the carbon layer is prevented or attenuated, and damage caused by chemical reactions between the emitter material and the carbon layer is prevented (reduced, minimized, etc). In other words, damage such as that illustrated in FIG. 1C is avoided or lessened, and the circumference of the tip is not degraded as shown. As a result, the cathodes of the invention have lifetimes which extend well beyond those of conventional cathodes, while still providing high angular intensity and brightness. The invention thus provides a means to enhance electron source lifetimes by eliminating direct contact between carbon coatings and cathode crystalline material, e.g. at least in the vicinity of the tip.

Figure 2A:
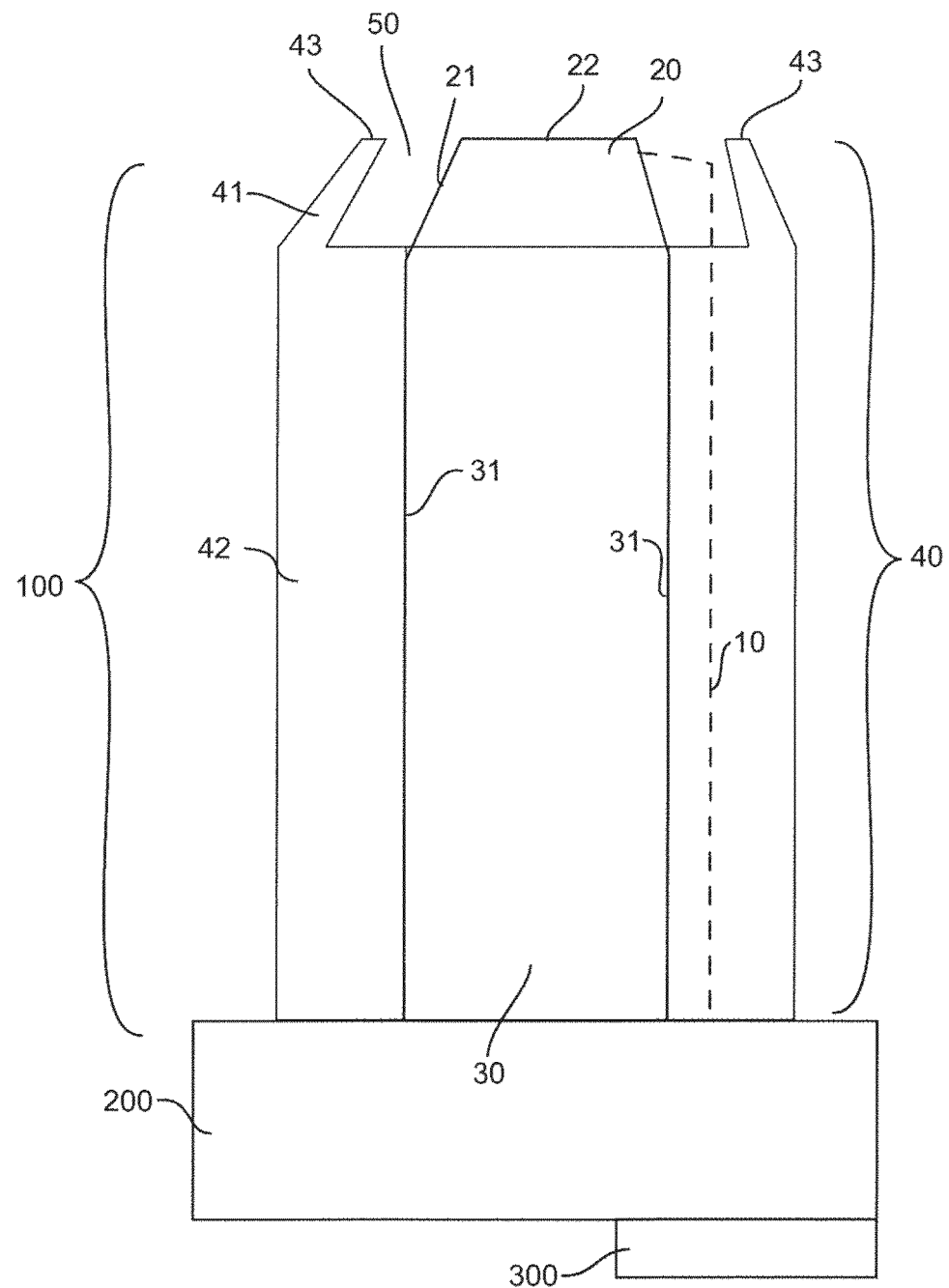
FIG. 2A-C. A, cross-sectional side view of a cathode of the invention; B, end-on view of a cathode of the invention in the plane of the emitter surface; C, side view of cathode tip. Drawings are not to scale.

FIG. 2A is a schematic cross sectional side view of an exemplary cathode of the invention. With reference to FIG. 2A, what is depicted is cathode 100 immobilized (held, affixed, etc.) in cathode holder 200. Cathode 100 comprises an emitter 10 comprising upper section 20 (which may be conical) and emitter body 30. Upper section 20 of emitter 10 comprises electron emitting surface 22 and upper surface 21. Emitter body 30 comprises exterior surface 31. Cathode 100 further comprises coating 40 which comprises upper coating 41 and lower coating 42. As can be seen, lower coating 42 is immediately adjacent to and attached directly to exterior surface 31 along the length of exterior surface 31. Lower coating 42 surrounds and is in contact with exterior surface 31 of emitter body 30. In contrast, upper coating 41 does not make direct contact with upper surface 21. Rather, gap 50 intervenes between (is present between) the two. The gap 50 can range e.g. from about 1 μm to about 15 μm in width; however, the gap can be smaller or larger depending on the application.

Figure 2B:
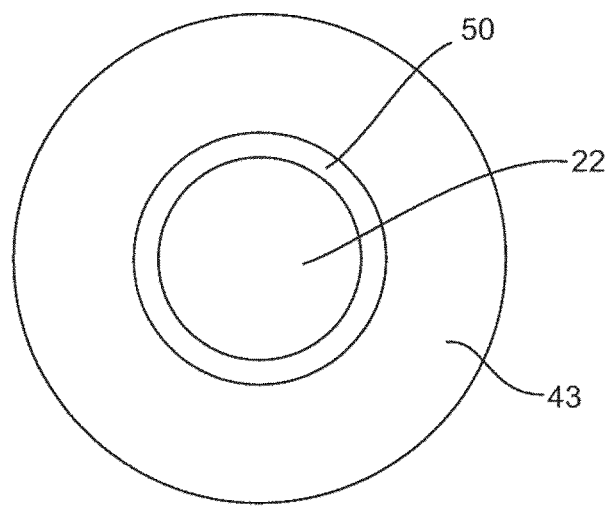
Figure 2C:
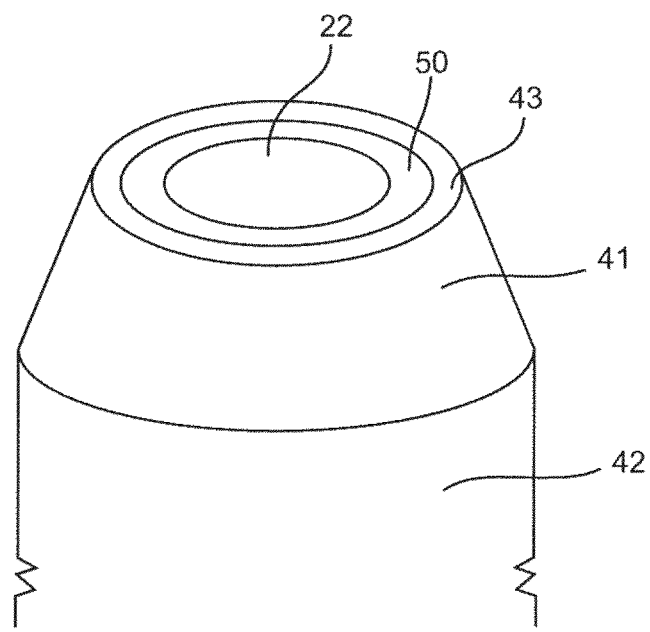

FIG. 2B depicts a schematic representation looking down on the tip of a cathode of the invention in the plane of the electron emitting surface. This figure shows central electron emitting surface 22 surrounded by annular gap 50, which in turn is surrounded by top or upper exterior surface 43 (of upper coating 41 of coating 40; see FIG. 2A). FIG. 2C shows a side view of the tip of a cathode of the invention, showing electron emitting surface 22 surrounded by annular gap 50, which in turn is surrounded by top or upper exterior surface 43 of upper coating 41 above and contiguous with lower coating 42 of the coating.

Figure 3:
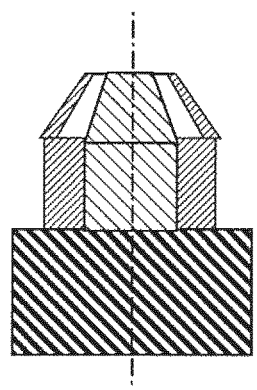
FIG. 3. Schematic representation of cross-section of an embodiment of the cathode of the invention.

FIG. 3 shows a schematic cross-sectional side view of an embodiment of the cathode of the invention.

Those of skill in the art will recognize that the emitting material of the cathode is generally a single crystal and may be formed from or contain any of several suitable types of crystalline materials, which may or may not be sintered. Exemplary electron emitting materials that may be used include but are not limited to single crystal lanthanum hexaboride (LaB6), single crystal cerium hexaboride (CeB6), single crystal hafnium carbide (HfC), sintered LaB6, sintered CeB6, sintered HfC, sintered tungsten-barium-oxygen-Al (W—Ba—Al—O), sintered scandate (Ba—Sc—W—O), etc. Those of skill in the art will recognize that "sintered" materials are those formed from particles that are bonded due to exposure to heat and/or pressure.

The emitter body is generally cylindrical or substantially cylindrical in shape, having straight sides which are coated with a carbon coating. In this section of the emitter, the carbon coating/layer is attached directly to the surface of the emitter. The length of the emitter body generally ranges from about 0.50 to about 3 mm. The emitter body cross-section is generally round or rectangular, with a diameter (or width, if a rectangle) in the range of from about 200 μm to about 800 μm, e.g. about 200, 300, 400, 500, 600, 700 or 800 μm.

An upper section of the emitter, e.g. about the upper 10-200 μm of the emitter crystal, may be conical, cylindrical, square, rectangular, pyramidal, etc. and all such embodiments are encompassed herein. The upper section is generally conical in shape, with a cone angle in the range of from about 0° (i.e. for a straight-sided cylindrical shape) to about 90° (for a cone shape). If conical, the cathode emitter cone angle should be no greater than about 90 degrees, and may be in the range from about 20 to about 90 degrees (e.g. about 20, 25, 30, 35, 40, 45, 50, 55, 60, 65, 70, 75, 80, 85 or 90 degrees) and is preferably in the range from about 60 to about 90 degrees (e.g. about 60, 65, 70, 75, 80, 85 or 90 degrees). In some embodiments, the cone angle is 60 degrees. An exemplary cone angle of 90 degrees is shown in FIG. 1A.

The upper (usually) conical section of the emitter is the section which is surrounded by but not directly contacted by the carbon coating, due to the presence of a gap between the coating and the conical surface. In some embodiments of the invention, the gap separating the emitter surface and the carbon coating is about 1 μm to about 15 μm wide, i.e. about 1, 2, 3, 4, 5, 6, 7, 8, 9, 10, 11, 12, 13, 14, or 15 μm in width. The depth of the gap along the conical surface is generally from about 10 to about 200 μm, and typically extends over (encompasses, covers, etc.) the entire cone surface, ending at the top of the emitter body. The gapped or spaced apart carbon layer which surrounds the cone generally follows the contours of the cone and is thus itself conical and positioned at an angle that is the same as or similar to that of the cone (see FIG. 2A).

The carbon layer or coating may be formed from any suitable material, examples of which include but are not limited to graphite, colloidal graphite (e.g. aquadag), DLC (diamond-like carbon), pyrolytic carbon, etc.

The cathode emitter tip may be flat or spherical, and may range in size from as small as about 5 μm to as large as about 400 μm in diameter, depending on the desired degree of truncation and the desired cone angle.

Exemplary prior art cathodes with carbon coated emission surfaces are described, for example, in U.S. Pat. No. 7,176,610, the complete contents of which is hereby incorporated by reference in entirety.

The invention also provides a cathode apparatus or assembly. The assembly includes the electron source, or cathode as described above, a cathode holder or support, and an emitter heater operably connected to the cathode in a manner that provides sufficient heat to the cathode to cause electron emission. The heater is illustrated schematically in FIG. 2A as emitter heater 300.

Figure 4A:
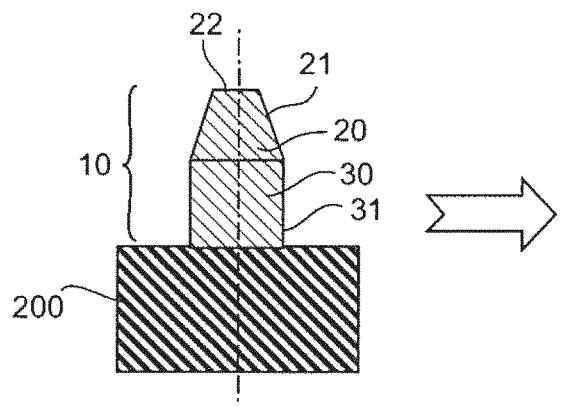
FIG. 4A-D. Schematic of the steps or stages of making a cathode of the invention. A, emitter material ensconced in cathode holder; B, conical surface of emitter and tip coated with temporary, or sacrificial, coating; C, both the temporary coating at the conical surface and the surface of the of the emitter body are coated with a carbon coating; D, temporary coating has been removed, leaving a gap (shown in white) between the surface of the conical portion of the emitter and the coating that surrounds, but does not directly contact, that surface.
Figure 4B:
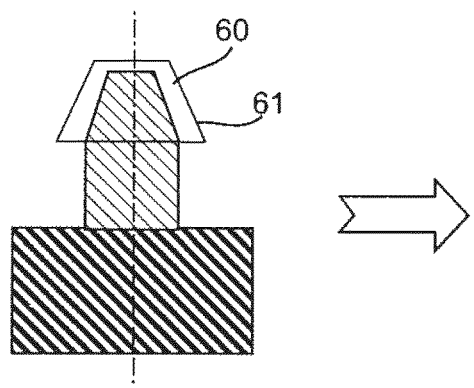
Figure 4C:
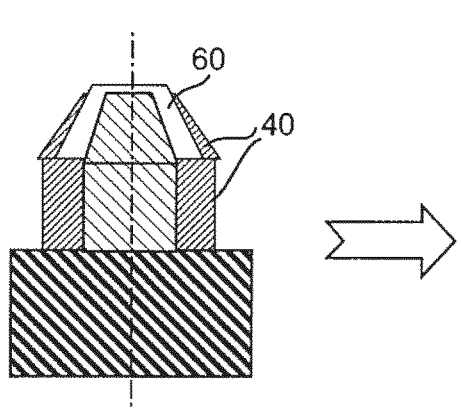
Figure 4D:
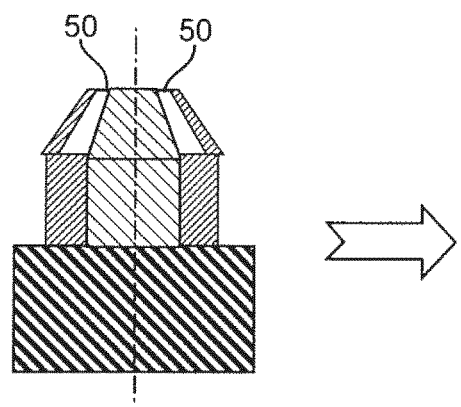

The invention also encompasses methods for making the cathodes described herein. In general, the manufacture of the cathodes of the invention is carried out according to methods and steps known in the art, except that a gap is introduced between the emitter cone surface and the carbon coating. In one embodiment, this is accomplished by applying a temporary or sacrificial coating to the conical electron emitting surface of the emitter prior to applying the carbon coating to the emitter, and then exposing the temporary coating to conditions which cause its removal e.g. cause it to disintegrate, melt, evaporate, dissolve. This is illustrated schematically in FIGS. 4A-D. With reference to FIG. 4A, emitter 10 comprises emitter body 30 having exterior surface 31 and conical section 20 having conical surface 21 and tip 22. Emitter 10 is held in cathode holder 200. FIG. 4B shows that temporary coating 60 (with surface 61) has been applied to conical surface 21. In the illustrated embodiment, temporary coating 60 is also applied to tip 22 of the cathode. However, this need not always be the case. Temporary coating 60 may be applied only to conical surface 21. FIG. 4C shows the cathode after carbon coating 40 has been applied to exterior surface 31 of the emitter body and to exterior surface 61 of the temporary coating. If the temporary coating 61 has also been applied to tip 22 (as illustrated in FIG. 4B), the section of temporary coating 60 that covers tip 22 is not coated with carbon, as this would occlude electron emission from tip 22 in the final product (i.e. after removal of temporary coating 60). The form of the cathode depicted in FIG. 4C (with temporary coating 60 and carbon coating 40 in place) may be referred to herein as an "intermediate cathode". Thereafter, this intermediate cathode is subjected to conditions that cause removal of temporary coating 60. FIG. 4D shows the finished product after removal of temporary coating 60. As can be seen, temporary coating 60 is no longer present and instead, gap 50 is interposed between conical surface 21 and carbon coating 40. The portion of the carbon coating that surrounds but does not contact the cone is contiguous with the layer of carbon that coats the emitter sides, i.e. the two are continuous and connected in an unbroken, uninterrupted manner.

The temporary coating, which may also be referred to herein as a sacrificial layer (film, coating, etc.) that is applied to the conical surface of the emitter is generally made from one or more materials that can be removed from the cathode emitter in a manner that does not affect the other components of the cathode. Exemplary materials that may be used to form the temporary coating include but are not limited to: various organic films, acrylic resin, nitrocellulose, etc. In some embodiments, the temporary coating is an organic film, examples of which include but are not limited to: 4-methacryloyloxyethyl trimellitate anhydride (4-META), methyl methacrylate (MMA) (meta-methyl-metacrylate).

The methods of fabricating the long-life (extended-life) cathodes of the invention include, but are not limited to, the following steps:
1. Providing an emitter comprising an emitter body, a conical portion or section and a tip.
2. Coating the conical portion and, optionally, the tip of the emitter with a temporary, sacrificial layer or coating.
3. Applying a layer of carbon to the exterior surfaces of the emitter body and the temporary coating, wherein the carbon is applied to the temporary coating only over the conical portion, but not to the temporary coating at the tip of the cathode. This step results in the formation of an intermediate cathode having a temporary protective layer (e.g. see FIG. 4C).
4. Subjecting the intermediate cathode to conditions which result in removal of the temporary or sacrificial layer, without damaging the other cathode components. This step leaves a gap several microns wide between the crystal and the carbon coating in the vicinity of the conical portion of the emitter.

Those of skill in the art will recognize that the conditions which are used to remove the temporary, sacrificial layer will vary according to the type of material that is used to form the layer. For example, if the layer is an organic film, then heat may be used to remove the layer. Exemplary conditions for doing so include, for example, heating the intermediate cathode to a temperature in the range of from about 400 to about 600° C., under conditions that are known to those of skill in the art. Under such conditions, the organic film evaporates, leaving a space or gap.

Those of skill in the art will be aware of other types of temporary protective layers that may be employed, and methods for their removal, e.g. forming the temporary layer from a soluble material and exposing the intermediate cathode to a suitable solvent (e.g. water, an organic solvent, etc.), or by forming the temporary layer from a photolabile material and exposing the intermediate cathode to a wavelength of light suitable to trigger breakdown or disintegration of the material. The temporary film may be formed from any suitable material and may be removed by any suitable method which causes removal without damaging the other cathode components, including without limitation: etching, dissolving, evaporating, melting, ablation, etc.

The thermionic cathode of the invention may be used in electron beam lithography tools, scanning electron microscopes, etc., or in any other application where a thermionic cathode might be utilized.

References: the following references are hereby incorporated by reference in entirely:
1. M. Gesley, F. Hohn, J. Appl. Phys. 64 (7), October 1988, pp. 3380-3392.
2. U.S. Pat. No. 7,176,610 B2, Feb. 13, 2007.

While the invention has been described in terms of its preferred embodiments, those skilled in the art will recognize that the invention can be practiced with modification within the spirit and scope of the appended claims. Accordingly, the present invention should not be limited to the embodiments as described above, but should further include all modifications and equivalents thereof within the spirit and scope of the description provided herein.

I claim:
1. A thermionic cathode comprising
a central crystalline or sintered electron emitting source having an upper section and sides;
and a carbon coating applied directly to an outer surface of said sides, said carbon coating comprising a contiguous extended portion which surrounds said upper section and extends to a tip section of said upper section, and is spaced apart from said upper section by a gap, wherein said upper section includes said tip section.

2. A thermionic cathode as in claim 1, wherein said crystalline or sintered electron emitting source is formed from a material selected from the group consisting of lanthanum hexaboride (LaB6), cerium hexaboride (CeB6), hafnium carbide (HfC), sintered LaB6, sintered CeB6, sintered HfC, sintered tungsten-barium-oxygen-Al (W—Ba—Al—O), and sintered scandate (Ba—Sc—W—O).

3. The thermionic cathode as in claim 1, wherein said upper section is conical.

4. A thermionic cathode as in claim 3, wherein said upper section has a cone angle in a range between 0 and 90 degrees.

5. A thermionic cathode as in claim 1, wherein said carbon coating is selected from the group consisting of graphite, colloidal graphite, DLC (diamond-like carbon), and pyrolytic carbon.

6. A thermionic cathode as in claim 1, wherein said gap is from 1 µm to 15 µm wide.

7. The thermionic cathode of claim 1, wherein and evaporation rate of said carbon coating is about 1000 times lower than that of said central crystalline or sintered electron emitting source.

8. The thermionic cathode of claim 1, wherein an operating temperature of said thermionic cathode is from 1650 to 1900 K.

9. An electron emission apparatus, comprising a thermionic cathode comprising a central crystalline or sintered electron emitting source having an upper section comprising a tip section and sides; and a carbon coating applied directly to an outer surface of said sides and having a contiguous extended portion which surrounds said upper section and extends to said tip section of said upper section, and wherein said upper section and said carbon coating are separated by a spatial gap,
a heater for said central crystalline or sintered electron emitting source; and
a support for said central crystalline or sintered electron emitting source.

10. The electron emission apparatus of claim 9, wherein said upper section is conical.

11. A method of manufacturing a thermionic cathode, comprising
- coating an upper section of a crystalline or sintered electron emitting source with a sacrificial film, wherein said upper section includes a tip section;
- applying a carbon coating directly to an outer surface of sides of said crystalline or sintered emitter and over said sacrificial film; and
- removing said sacrificial film to leave said carbon coating surrounding said upper section and extending to said tip section of said upper section, but spaced apart from said upper section while retaining said carbon coating on said outer surface of sides of said crystalline or sintered emitter.

12. The method of claim 11, wherein said upper section is conical.

13. The method of claim 11, wherein said step of removing is carried out by a technique selected from the group consisting of etching, dissolving, and evaporating.

14. The method of claim 11, wherein said sacrificial film is formed from an organic material and said step of removing is carried out by applying heat sufficient to cause evaporation of said organic material.

15. The method of claim 14, wherein said organic material is acrylic resin.

\* \* \* \* \*